(12) United States Patent
Adhikari et al.

(10) Patent No.: US 8,275,478 B2
(45) Date of Patent: Sep. 25, 2012

(54) METHOD AND APPARATUS FOR ROUTING WAFER PODS TO ALLOW PARALLEL PROCESSING

(75) Inventors: Diwaskar Adhikari, Austin, TX (US); Raymond G. Goss, Austin, TX (US); Carmen A. Maxim, Austin, TX (US); Jan Rothe, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 488 days.

(21) Appl. No.: 12/403,632

(22) Filed: Mar. 13, 2009

(65) Prior Publication Data

US 2010/0232914 A1 Sep. 16, 2010

(51) Int. Cl.
*G06F 19/00* (2011.01)
(52) U.S. Cl. .......................... 700/112; 700/117; 414/217
(58) Field of Classification Search .......... 700/117–121, 700/112; 414/217
See application file for complete search history.

(56) References Cited

U.S. PATENT DOCUMENTS

| | | | | |
|---|---|---|---|---|
| 6,188,323 B1 * | 2/2001 | Rosenquist et al. | ........ | 340/686.5 |
| 6,208,751 B1 * | 3/2001 | Almogy | ........................ | 382/149 |
| 6,393,334 B1 * | 5/2002 | Lewis et al. | .................... | 700/117 |
| 6,418,979 B1 * | 7/2002 | Lewis et al. | ........................ | 141/4 |
| 6,658,321 B2 * | 12/2003 | Osaka et al. | .................. | 700/218 |
| 6,853,876 B2 * | 2/2005 | Wehrung et al. | .............. | 700/230 |
| 7,578,650 B2 * | 8/2009 | Aalund et al. | ................. | 414/806 |
| 7,894,926 B2 * | 2/2011 | Lacaille | ........................ | 700/121 |
| 7,925,370 B2 * | 4/2011 | Yamazaki et al. | ............. | 700/121 |
| 2002/0038164 A1 * | 3/2002 | Osaka et al. | ................... | 700/213 |
| 2002/0092369 A1 * | 7/2002 | Hunter | ......................... | 73/865.9 |
| 2002/0124906 A1 * | 9/2002 | Suzuki et al. | .................... | 141/98 |
| 2004/0111339 A1 * | 6/2004 | Wehrung et al. | ................ | 705/30 |
| 2004/0187451 A1 * | 9/2004 | Suzuki et al. | ................... | 55/385.1 |
| 2004/0198196 A1 * | 10/2004 | Walsh et al. | ..................... | 451/58 |
| 2006/0045662 A1 * | 3/2006 | Aalund et al. | ................. | 414/217 |
| 2008/0082197 A1 * | 4/2008 | Lacaille | ........................ | 700/121 |
| 2009/0003977 A1 * | 1/2009 | Aburatani et al. | ............ | 414/217 |
| 2009/0062956 A1 * | 3/2009 | Chen et al. | ..................... | 700/214 |
| 2009/0209095 A1 * | 8/2009 | Horii | .............................. | 438/585 |

OTHER PUBLICATIONS

SEMI Specification E94-1107, Specification for Control Job Management, 2000, 2007.

* cited by examiner

*Primary Examiner* — Ramesh Patel
*Assistant Examiner* — Anthony Whittington
(74) *Attorney, Agent, or Firm* — Williams, Morgan & Amerson, P.C.

(57) ABSTRACT

A method includes designating a plurality of wafers as members of a group. A first subset of the wafers is housed in a first wafer pod and a second subset of the wafers is housed in a second wafer pod. The first wafer pod is routed to a first tool, and at least a first operation is performed on the wafers in the first subset using the first tool. The second wafer pod is routed to a second tool, and the first operation is performed on the wafers in the second subset using the second tool. The wafers in the first and second subsets are consolidated following the performing of the first operation.

16 Claims, 5 Drawing Sheets

METHOD AND APPARATUS FOR ROUTING WAFER PODS TO ALLOW PARALLEL PROCESSING

CROSS-REFERENCE TO RELATED APPLICATIONS

Not applicable.

BACKGROUND

This disclosed subject matter pertains to automated manufacturing environments, such as semiconductor manufacturing, and, more particularly, to a method and apparatus for routing wafer pods to allow parallel processing.

Growing technological requirements and the worldwide acceptance of sophisticated electronic devices have created an unprecedented demand for large-scale, complex, integrated circuits. Competition in the semiconductor industry requires that products be designed, manufactured, and marketed in the most efficient manner possible. This requires improvements in fabrication technology to keep pace with the rapid improvements in the electronics industry. Meeting these demands spawns many technological advances in materials and processing equipment and significantly increases the number of integrated circuit designs. These improvements also require effective utilization of computing resources and other highly sophisticated equipment to aid, not only design and fabrication, but also the scheduling, control, and automation of the manufacturing process.

Turning first to fabrication, integrated circuits, or microchips, are manufactured from modern semiconductor devices containing numerous structures or features, typically the size of a few micrometers or less. The features are placed in localized areas of a semiconducting substrate, and are either conductive, non-conductive, or semi-conductive (i.e., rendered conductive in defined areas with dopants). The fabrication process generally involves processing a number of wafers through a series of fabrication tools. Each fabrication tool performs one or more of four basic operations discussed more fully below. The four basic operations are performed in accordance with an overall process to finally produce the finished semiconductor devices.

Integrated circuits are manufactured from wafers of a semiconducting substrate material. Layers of materials are added, removed, and/or treated during fabrication to create the integrated, electrical circuits that make up the device. The fabrication essentially comprises the following four basic operations:

layering, or adding thin layers of various materials to a wafer from which a semiconductor is produced;
patterning, or removing selected portions of added layers;
doping, or placing specific amounts of dopants in selected portions of the wafer through openings in the added layers; and
heat treating, or heating and cooling the materials to produce desired effects in the processed wafer.

Although there are only four basic operations, they can be combined in hundreds of different ways, depending upon the particular fabrication process.

To facilitate processing of wafers through a process flow, wafers are typically grouped into lots. Each lot is typically housed in a common wafer pod wafer, commonly referred to as front opening unified pod (FOUP). FOUPs or pods are transported to various process and metrology tools throughout the fabrication facility to allow the required processes to be completed to fabricate integrated circuit devices on the wafers.

Modern wafer fabrication facilities employ automated material movement systems to satisfy ergonomic concerns and to maintain a high level of automation. An interbay/intrabay vehicle automated material handling system (AMHS) may be employed to automate the transfer of wafers to the tools required in the process flow. One factor contributing to the efficiency of the material handling system is the delivery time between tools. Delivery time may vary depending on the distance between tools, the congestion of the tools, and the distance an idle material handling vehicle needs to travel to pick up a waiting wafer pod.

A semiconductor foundry, commonly referred to as a fab, attempts to streamline its manufacturing operations and measures success using specific attributes such as: quality of delivery (cycle time, just in time), quality of the process and product (yield, product performance), quantity (throughput), and cost (wafer/die cost). While tuning the foundry for just one of these factors is rather simple, a more holistic approach needs to provide the right balance by optimizing the operational scenarios, lot and batch sizes, equipment qualification scenarios, etc.

Considering state of the art facilities, regular production runs in 300 mm fabs facilitate lots of 25 wafers in a wafer pod. An automated material handling system in conjunction with a Manufacturing Execution System (MES) manages the transportation and tracking of pods. Fabs with up to 150K wafer starts per month can have a Work In Process (WIP) in excess of half a million wafers. The corresponding inventory requires huge stocker capacities. The inventory represents a considerable amount of bound capacity with the associated risk and also the required stocker capacity mandates a significant investment in automation equipment and floor space.

A reduction of cycle time will reduce inventory, at the same time reducing the capital risk and relaxing the requirements for stockers. A short cycle time also helps identifying yield and design issues quicker, thus enabling the improvement of the quality of process and products. It is important to note that, while cycle time reduction seems to provide means to improve many fab performance attributes, a reduction of cycle time should usually not be performed at the expense of throughput.

Looking further into the topic of cycle time reveals that during manufacturing, wafers in a pod spend hours waiting for the next equipment to become available for processing. Unfortunately this waiting time cannot easily be eliminated because a certain amount of WIP has to be present at every operation to enable efficient use of the capital invested in the equipment. But even after arrival at the equipment, wafers in the pods spend considerable time sitting idle on load ports (LP) waiting for the previous lot to finish, waiting for the first wafers of their own lots to finish processing or waiting for the remaining wafers in their lot to finish processing.

In addition to production routes, the AMHS and MES manage the flow for non-product wafers. For instance on a typical monitoring route, test wafers (TWs) go through a series of pre-measurement steps, get processed on a tool (either for tool qualification purpose or for process monitoring) and then finally go through a series of post measurement steps. For better (and simpler) management of reserving and dispatching test wafers, the tendency has been to consolidate the test wafers into logical units called test wafer kits and then to physically consolidate them in single pod if the source wafers are scattered in multiple pods at the time the kit is specified.

The conventional qualification process requires the usage of a wafer sorter for assembling and disassembling the wafers in a single pod, and sequential processing of the test wafers in the metrology chains. The sorting and sequential processing constraints result in an increase in time required to complete the processing of the kit to accomplish the qualification or process monitoring goal.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes designating a plurality of wafers as members of a group. A first subset of the wafers is housed in a first wafer pod and a second subset of the wafers is housed in a second wafer pod. The first wafer pod is routed to a first tool, and at least a first operation is performed on the wafers in the first subset using the first tool. The second wafer pod is routed to a second tool, and the first operation is performed on the wafers in the second subset using the second tool. The wafers in the first and second subsets are consolidated following the performing of the first operation.

Another aspect of the disclosed subject matter is seen in a system for processing a plurality of wafers defined as members of a group, wherein a first subset of the wafers is housed in a first wafer pod and a second subset of the wafers is housed in a second wafer pod. The system includes a plurality of tools operable to process wafers and a material handling controller. The material handling controller is operable to route the first wafer pod to a first tool, route the second wafer pod to a second tool, and direct consolidation of the wafers in the first and second subsets following a performing of the first operation using the first and second tools to assemble the plurality of wafers in the group.

BRIEF DESCRIPTION OF THE SEVERAL VIEWS OF THE DRAWINGS

The disclosed subject matter will hereafter be described with reference to the accompanying drawings, wherein like reference numerals denote like elements, and.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
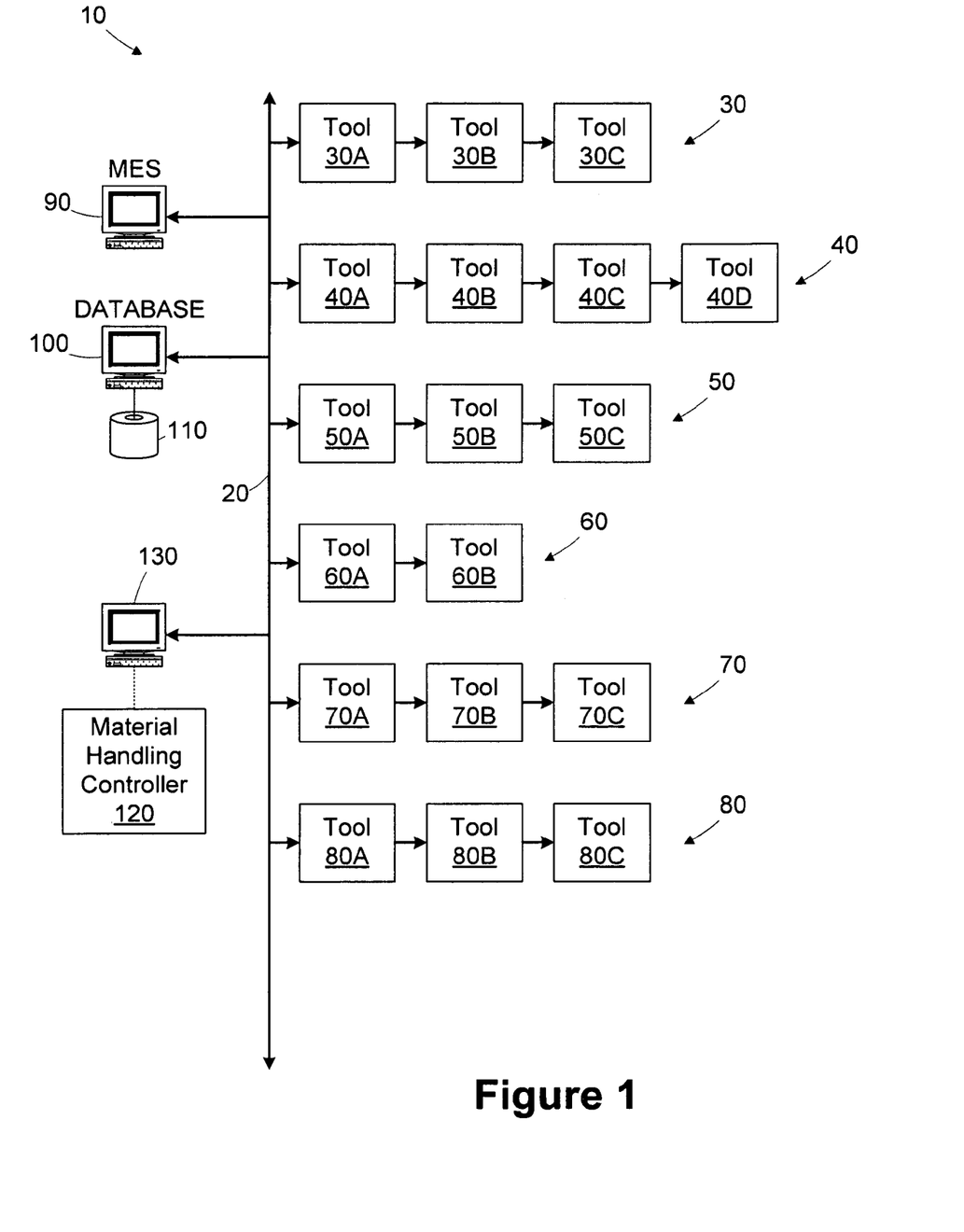
FIG. 1 is a simplified block diagram of a manufacturing system.

Referring now to the drawings wherein like reference numbers correspond to similar components throughout the several views and, specifically, referring to FIG. 1, the disclosed subject matter shall be described in the context of an illustrative manufacturing system 10. The manufacturing system 10 includes a network 20, a plurality of tools 30-80, a manufacturing execution system (MES) server 90, a database server 100 and its associated data store 110, and a material handling controller 120 executing on a workstation 130.

In the illustrated embodiment, the manufacturing system 10 is adapted to fabricate semiconductor devices. Although the disclosed subject matter is described as it may be implemented in a semiconductor fabrication facility, the subject matter is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices.

Portions of the detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The network 20 interconnects various components of the manufacturing system 10, allowing them to exchange information. Each of the tools 30-80 may be coupled to a computer (not shown) for interfacing with the network 20. The tools 30-80 are grouped into sets of like tools, as denoted by lettered suffixes. For example, the set of tools 30A-30C represent tools of a certain type, such as a chemical mechanical planarization (CMP) tool.

A particular wafer or lot of wafers progresses through the tools 30-80 as it is being manufactured, with each tool 30-80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30-80 are illustrated in a rank and file grouping for illustrative purposes only. In an actual implementation, the tools 30-80 may be arranged in any physical order or grouping. Additionally, the connections between the tools in a particular grouping are meant to represent connections to the network 20, rather than interconnections between the tools 30-80.

The manufacturing execution system (MES) server 90 directs the high level operation of the manufacturing system 10. The MES server 90 monitors the status of the various entities in the manufacturing system 10 (i.e., lots, tools 30-80) and controls the flow of articles of manufacture (e.g., lots of semiconductor wafers) through the process flow. The database server 100 stores data related to the status of the various entities and articles of manufacture in the process flow using one or more data stores 110. The data may include preprocess and post-process metrology data, tool states, lot priorities, etc.

The MES server 90 stores information in the data store 110 related to the particular tools 30-80 (i.e., or sensors (not shown) associated with the tools 30-80) used to process each lot of wafers. As metrology data is collected related to the lot, the metrology data and a tool identifier indicating the identity of the metrology tool recording the measurements is also stored in the data store 110. The metrology data may include feature measurements, process layer thicknesses, electrical performance, surface profiles, etc. Data stored for the tools 30-80 may include chamber pressure, chamber temperature, anneal time, implant dose, implant energy, plasma energy, processing time, etc. Data associated with the operating recipe settings used by the tool 30-80 during the fabrication process may also be stored in the data store 110. For example, it may not be possible to measure direct values for some process parameters. These settings may be determined from the operating recipe in lieu of actual process data from the tool 30-80.

The distribution of the processing and data storage functions amongst the different computers 90, 100, 130 is generally conducted to provide independence and a central information store. Of course, different numbers of computers and different arrangements may be used. Moreover, the functions of some units may be combined. For example, the MES server 90 and the material handling controller 120 may be combined into a single unit.

Figure 2:
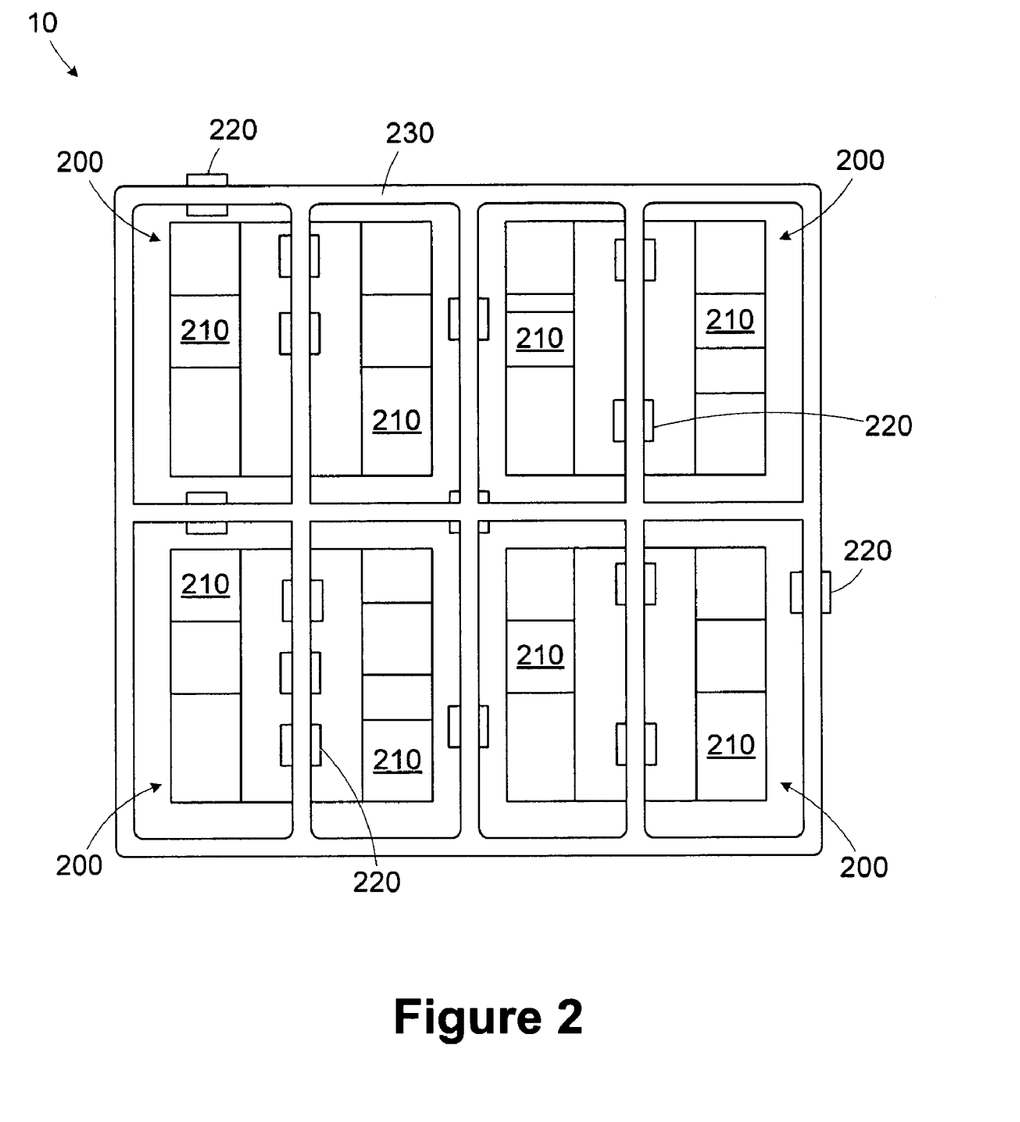
FIG. 2 is a simplified layout diagram of the manufacturing system.

As will be described in greater detail below, the material handling controller 120 determines the allocation of material handling resources throughout the fabrication facility. FIG. 2 illustrates a simplified layout diagram of the manufacturing system 10. The layout diagram is not intended to reflect an actual physical diagram of the layout, but rather a reduced scope conceptual diagram used in illustrating the techniques described herein. The manufacturing system 10 includes a plurality of control areas 200, sometimes referred to as bays. In FIG. 2, four control areas are illustrated, however, in an actual fabrication facility, many more control areas (e.g., 20-30) would be present. Each control area includes a plurality of tools 210 (e.g., the tools 30-80) of FIG. 1. The particular tools 210 selected for each control area 200 may vary depending on the organization of the fabrication facility. In one example, tools in a common tool family may be grouped in common control areas 200. Hence, photolithography tools may be located in one control area 200, while etch tools may be located in another control area 200. In another example, the tools 210 may be grouped by process layer. Hence, the tools required to form a particular layer (i.e., starting with a photolithography step and terminating prior to the next photolithography step) may be grouped into a common control area 200.

In the system 10 of FIG. 2, material handling vehicles 220 are provided for moving wafer pods, also referred to as front opening unified pods (FOUPs), to tools 210 within a control area (i.e., intrabay moves) or between different control areas (i.e., interbay moves). The number of material handling vehicles 220 and wafer pods may vary depending on the particular implementation. In the illustrated embodiment, an overhead transit framework 230 is provided. The material handling vehicles 220 are suspended from the framework 230 as they transit the system 10. However, it should be understood that the present subject matter is not limited to use with vehicles that are suspended from such a framework. Rather, the present subject matter may be employed with any type of material handling system that delivers wafer pods to a tool or location.

In the illustrated embodiment, the material handling controller 120 complies employs various job management rules for purposes of controlling the flow of wafers and pods throughout the facility. Exemplary management rules are described in SEMI E94-1107, "Specification for Control Job Management."

One job management approach used by the material handling controller 120 provides that a source pod and a target pod for a particular control job need not be defined at the time the control job is created. Instead, the material handling controller 120 employs a material redirection mode that allows the removal of a source pod from the load port of a tool 210 (e.g., metrology tool or process tool) after all wafers that need to be processed have been moved into the tool and the specifying of a target pod for the wafers of the control job after the processing has started, but prior to the first wafer finishing processing. This redirection approach removes and dependency between the assigned pod and the control job. The following example illustrates the redirection approach.

After the source pod has been delivered to the tool 210, the material handling controller 120 sets up the jobs for processing the material, but only specifies the source pod, but not the destination pod for the control job. After the start of processing, and after all wafers have moved into the tool 210, the material handling controller 120 allows the control job to release the source pod resulting in pod removal, thus freeing up a load port.

Once the material handling controller 120 assigns a proper destination pod (i.e., before the first wafer of the control job finishes processing), the destination pod is transferred to a load port of the tool 210 for retrieving the wafers before the first wafer completes processing. After the material handling controller 120 updates the control job with the information about the destination pod, the tool 210 will move the processed wafers into the destination pod. When all the wafers of the job have finished processing and have moved to their destination, the pod will be ready to be transferred to a stocker or the next tool 210 for processing. Note that using the source pod of a previous lot that just finished delivering its wafers as a destination pod for a different control job, rather than unloading the emptied pod and replacing it with a different destination pod, will save several AMHS operations.

In the illustrated embodiment, the material handling controller 120 employs the material redirection mode to reduce AMHS moves for the non-production wafers in a particular test kit. For instance on a typical monitoring route, test wafers (TWs) go through a series of pre-process steps at a metrology tool, cleaning tool, or other preparation tool, get processed on a process tool (e.g., either for tool qualification purpose or for process monitoring) and then finally go through a series of post process steps (e.g., metrology, cleaning, etc.) at another tool (i.e., which may be the same or different from the pre-process tool.

The operation of the material handling controller 120 to process such a dispersed wafer kit is illustrated in FIGS. 3A-D. At the time a test kit is designated, the members of the kit may be located in different pods, as they may have been previously associated with different lots. The material handling controller 120 employs material redirection to shorten the total length of time the test wafers spend in a process monitoring or equipment qualification flow to increase the availability of the data and to reduce the time that resources are committed to non-production wafers.

Figure 3A:
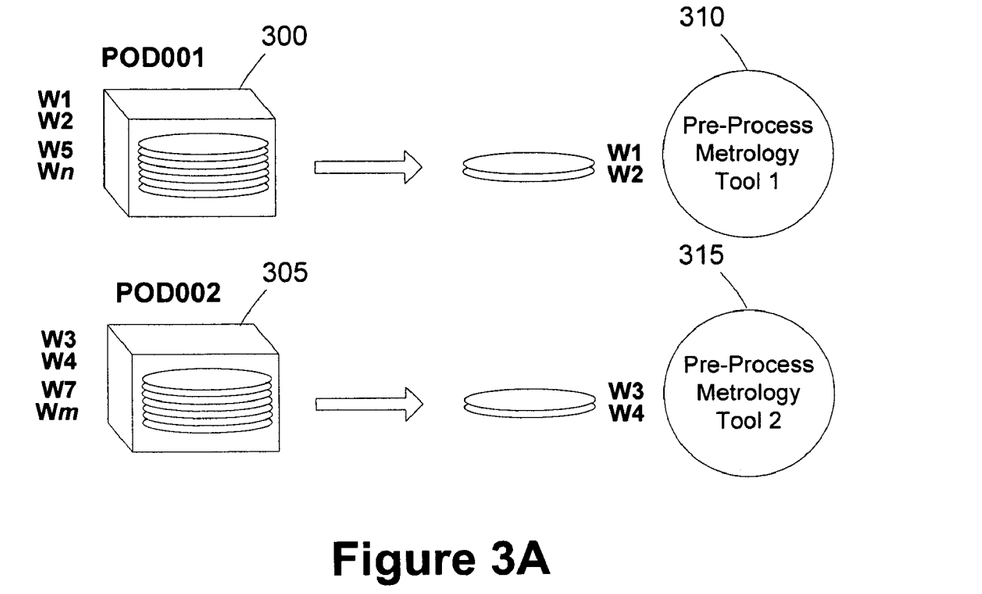
FIGS. 3A-3D illustrate routings for completing the processing of a test kit in accordance with one aspect of the present invention.

FIG. 3A illustrates the wafers at the time an exemplary test kit is specified. Wafers W1-W4 are identified by an operator, engineer, etc. as being the members of a test kit. In general, to complete the test kit operation, the wafers W1-W4 need to be measured in a pre-process metrology step, complete a processing step, and then be measured in a post-process metrology step. Although the pre and post process steps are discussed in the following example as being metrology steps, other types of pre and post process steps, such as cleaning or other type of preparation may be conducted.

In the illustrated example, wafers W1 and W2 are located in a first pod 300, and wafers W3 and W4 are located in a second pod 305. Of course, the specific distribution of wafers and the number of wafers in the test kit may vary. More than two source pods may be present. The general technique described herein maybe be scaled to accommodate more wafers distributed amongst different pods. Rather than move the pods 300, 305 to a sorter to consolidate the wafers W1-W4 of the test kit into a new pod, as would be done using conventional workflow practices, the material handling controller 120 employs redirection complete the required jobs without sorting.

First, the material handling controller 120 issues two control jobs. A first job is issued to send the wafers W1 and W2 in the first pod 300 to a first metrology tool 310 to receive the pre-processing metrology step. When the job is issued, the source pod is identified as the pod 300, and the destination pod remains unspecified. The second control job is issued to send the wafers W3 and W4 in the second pod 305 to a second metrology tool 315 to also receive the pre-processing metrology step. The source pod for the second control job is identified as the pod 305, and again the destination pod remains unspecified. After each pod 300, 305 arrives at the assigned metrology tool 310, 315, the pods 300, 305 are unloaded and removed from the load ports of the tools 310, 315. With this modification, the sorting task for wafer consolidation into a single pod is eliminated, and furthermore, the pre-measurements steps are no longer sequential and can be executed in parallel.

Although the metrology tools 310, 315 are shown as being distinct, it is possible that the same metrology tool may be used to perform pre-process metrology on the wafers W1-W4 in both pods 300, 305. For instance, if the transit time for the second pod 305 is longer than that of the first pod 300, the wafers W1, W2 could be unloaded, and the pod 300 removed from the load port before the second pod 305 arrives. This approach still avoids the need for the sorting step, but does result in the wafers being measured sequentially. In the case where the transit times and metrology process times are such that this approach would increase the cycle time, separate metrology tools may be used, as described above to keep the parallel processing aspect intact.

Figure 3B:
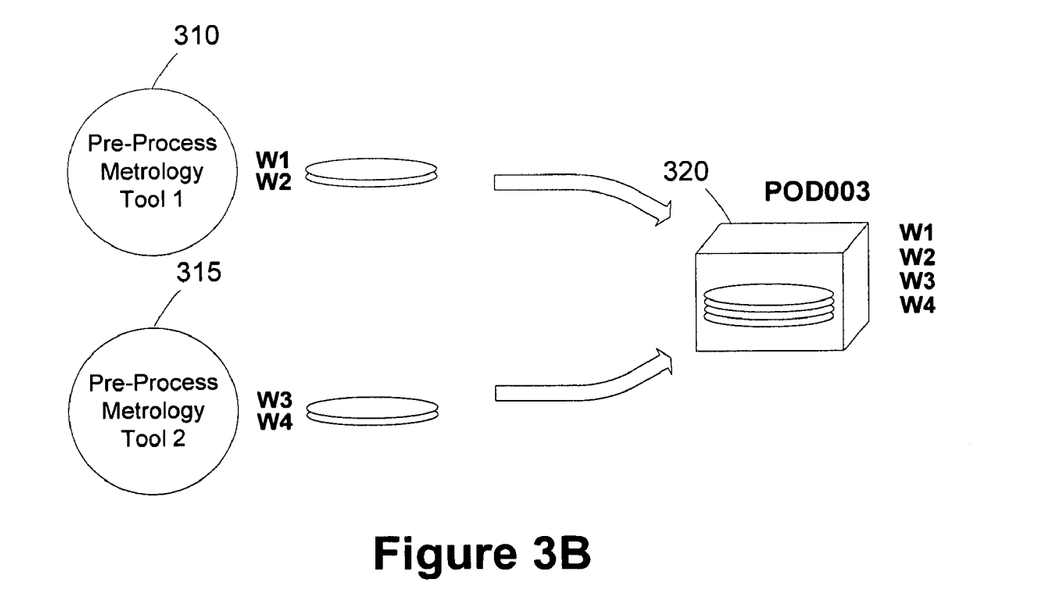

Continuing in FIG. 3B, once the pre-measurement steps are completed or nearing completion, an appropriate pod 320 is designated as a destination pod for the wafers W1-W4 in the first and second control jobs. The pod 320 is dispatched to the metrology tools 310, 315 to pick-up the wafers W1-W4. The pod 320 may be the same pod that delivered one of the subsets of wafers to one of the metrology tools 310, 315 or a different pod that is moved into position or is already at one of the metrology tools 310, 315 from a different operation. The material handling controller 120 typically employs an advanced scheduling algorithm to determine the order of the pickup. Factors such as transit time, measurement time, and queue depth may typically affect the pickup order.

Figure 3C:
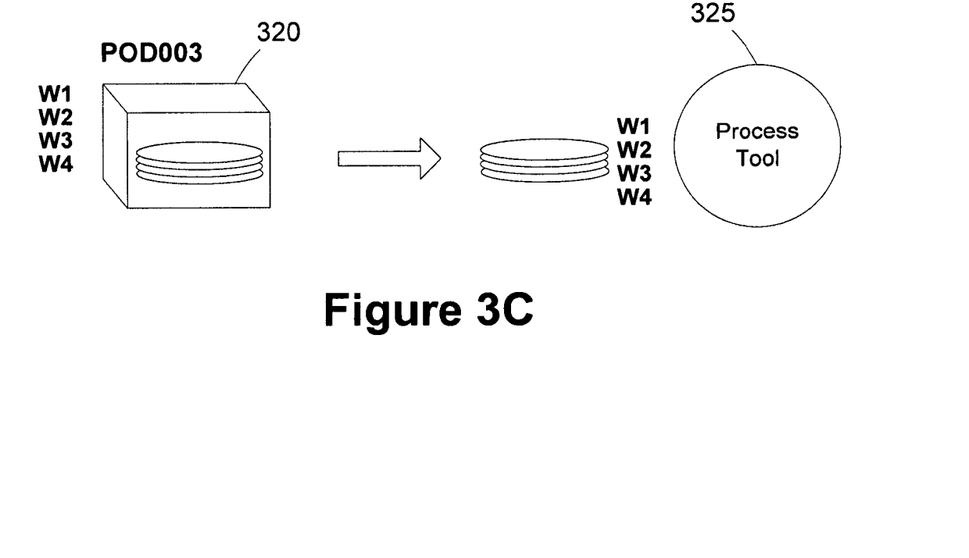

After pickup, a third control job is created for the processing step, as shown in FIG. 3C. The pod 320 is dispatched to a process tool 325 to complete the processing step. In the example of FIG. 3C, the destination pod for the processing control job remains the pod 320. However, it is possible that the pod 320 could be removed from the load port of the process tool 325 after the wafers W1-W4 are unloaded. The pod 320 could be used as a destination pod for a different group of wafers that are completing processing in the process tool 325. In that case a different pod would be assigned as the destination pod for the wafers W1-W4 after they have been unloaded, but before the first wafer in the group completes processing.

Figure 3D:
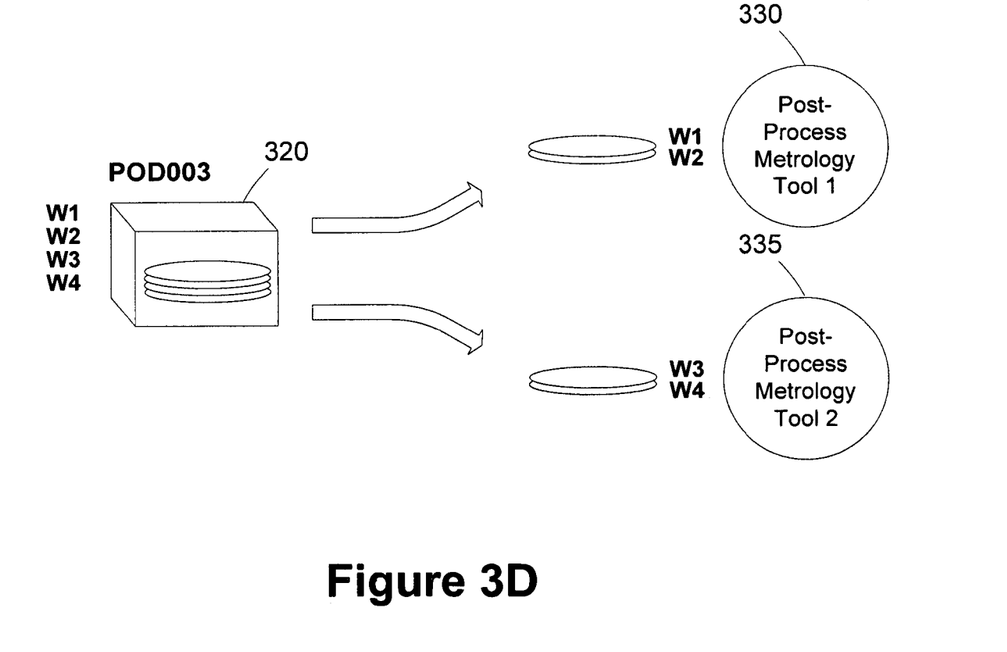

As shown in FIG. 3D, after the processing step completes, the pod 320 is dispatched to the post processing steps, dropping off the wafers W1, W2 at a first post-process metrology tool 330, and the wafers W3, W4 at a second post process metrology tool 335 to enable parallel measurements similar to those performed with the pre-process metrology step. Again, the post processing steps need not necessarily be metrology steps. Also, it is not necessary that the same parallel measurement relationship used for the pre-processing metrology (i.e., W1, W2 in one tool and W3, W4 in a second tool) be maintained for the post-processing metrology. The wafers may be distributed differently. Although the pre and post processing metrology tools 310, 315 330, 335 are illustrated as being different entities, the same tools may be used for pre and post processing metrology if the tools are capable of performing both metrology operations.

Figure 4A:
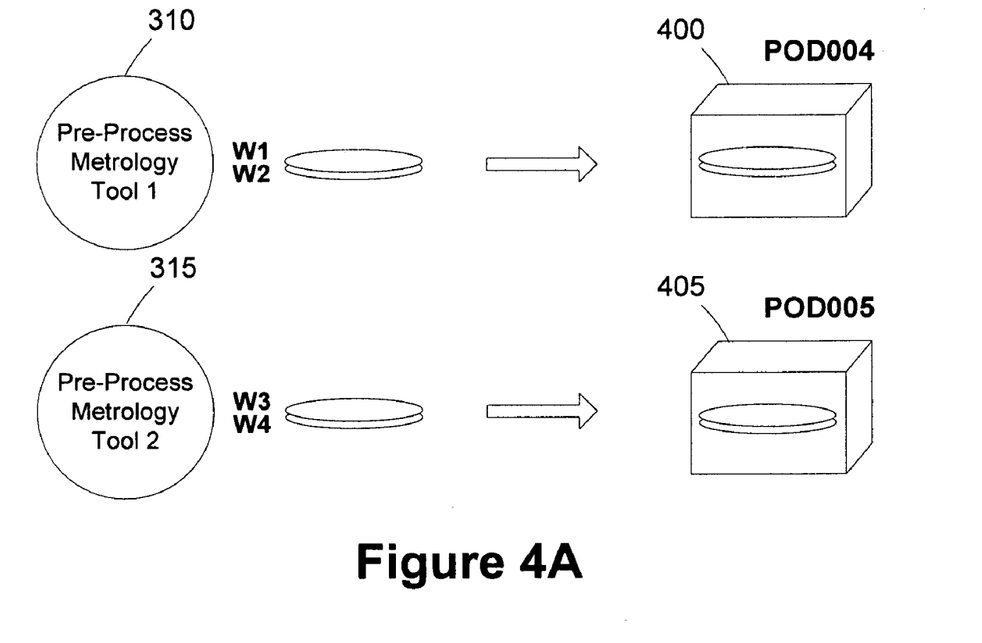
FIGS. 4A-B illustrate an alternative routing for completing the processing of a test kit.
Figure 4B:
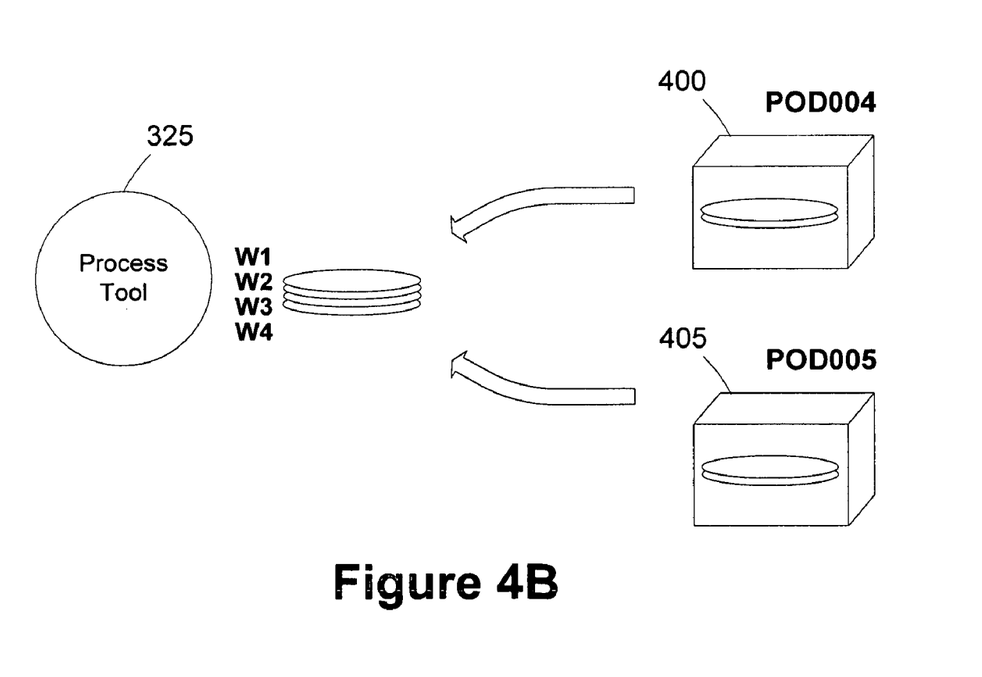

An alternative flow to the one described above in reference to FIGS. 3B-3C may be used to increase the degree of parallelism. Rather than consolidate the wafers in the test kit after the pre-process metrology step, they may be consolidated at the process step. FIGS. 4A-B show this alternative approach. In FIG. 4A, the wafers W1, W2 are loaded into a first destination pod 400, and the wafers W3, W4 are loaded into a second destination pod 405. Note that the pods 400, 405 may be the same pods that delivered the wafers to the respective metrology tools 310, 315 or different pods. As shown in FIG. 4B, the pods 400, 405 are transported to deliver their respective wafers to the process tool 325 for processing. Further processing of the test kit may proceed as shown in FIG. 3D. This approach eliminates any potential wait time that might be present while the pod 320 shown in FIG. 3B waits for all of the wafers W1-W4 to finish processing and traverses between the tools 310, 315.

A computer simulation performed of the example scenario described herein yields about 12.5% reduction of pod moves and corresponding AMHS traffic, in addition to the benefit achieved by eliminating the sorter step. The use of wafer redirection to provide parallel processing and eliminating sorts has the potential to significantly improve test wafer processing.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   designating a plurality of wafers as members of a group, wherein a first subset of the wafers is housed in a first wafer pod and a second subset of the wafers is housed in a second wafer pod different from the first pod;
   routing the first wafer pod to a first tool;
   performing at least a first operation on the wafers in the first subset using the first tool;
   routing the second wafer pod to a second tool;
   performing the first operation on the wafers in the second subset using the second tool;
   consolidating the wafers in the first and second subsets in a third wafer pod following the performing of the first operation by:
      routing the third wafer pod to the first tool;
      loading the first subset into the third wafer pod;
      routing the third wafer pod to the second tool; and
      loading the second subset into the third wafer pod to consolidate the wafers in the first and second subsets in the third wafer pod;
   routing the third wafer pod to a third tool;
   performing a second operation on the plurality of wafers using the third tool;
   loading the group of wafers in a fourth wafer pod following completion of the second operation;
   routing the fourth wafer pod to a fourth tool;
   unloading a third subset of the plurality of wafers into the fourth tool;
   performing a third operation on the third subset of wafers;
   routing the fourth wafer pod to a fifth tool;
   unloading a fourth subset of the plurality of wafers into the fifth tool;
   performing the third operation on the fourth subset of wafers; and
   loading the third and fourth subsets into a fifth wafer pod.

2. The method of claim 1, wherein the first operation comprises a metrology operation.

3. The method of claim 1, wherein the third wafer pod comprises one of the first or second wafer pods.

4. The method of claim 1, wherein the second operation comprises a process operation.

5. The method of claim 1, wherein the fourth wafer pod comprises the third wafer pod.

6. The method of claim 1, wherein the third operation comprises a metrology operation.

7. The method of claim 1, wherein the fifth wafer pod comprises the fourth wafer pod.

8. The method of claim 1, further comprising:
   initiating a first control job for routing the first wafer pod to the first tool, the first control job designating the first wafer pod as a first source wafer pod;
   initiating a second control job for routing the second wafer pod to the second tool, the second control job designating the second wafer pod as a second source wafer pod;
   identifying the third wafer pod as a destination wafer pod in the first and second control jobs.

9. The method of claim 8, wherein identifying the third wafer pod comprises identifying the third wafer pod as the destination wafer pod prior to one of the first subset of wafers completing processing using the first tool and prior to one of the second subset of wafers completing processing using the second tool.

10. The method of claim 9, wherein identifying the third wafer pod comprises identifying the third wafer pod as the destination wafer pod after unloading one of the first and second subsets into one of the first and second tools.

11. The method of claim 1, further comprising:
   removing the first wafer pod from a load port of the first tool after unloading the first subset of wafers; and
   removing the second wafer pod from a load port of the second tool after unloading the second subset of wafers.

12. The method of claim 11, further comprising assigning the third wafer pod to the first and second subsets after removing at least one of the first or second wafer pods from the first or second tool.

13. The method of claim 1, wherein designating a plurality of wafers as members of a group further comprises designating the plurality of wafers as a test kit.

14. The method of claim 13, wherein the test kit is associated with at least one of a tool qualification operation or a process monitoring operation.

15. The method of claim 1, wherein a third subset of the plurality of wafers is housed in a fourth wafer pod, and the method further comprises:
   routing the fourth wafer pod to a third tool;
   performing the first operation on the wafers in the third subset using the third tool; and
   consolidating the wafers in the third subset with the first and second subsets in the third wafer pod following the performing of the first operation in the third tool.

16. A system for processing a plurality of wafers defined as members of a group, wherein a first subset of the wafers is housed in a first wafer pod and a second subset of the wafers is housed in a second wafer pod different from the first pod, comprising:
   a plurality of tools operable to process wafers; and
   a material handling controller operable to:
      route the first wafer pod to a first tool,
      route the second wafer pod to a second tool,
      direct consolidation of the wafers in the first and second subsets into a third wafer pod following a performing of the first operation using the first and second tools to assemble the plurality of wafers in the group by directing the loading of the first and second subsets into the third destination wafer pod after the processing in the first and second tools, wherein the first operation is a pre-process metrology operation,
      route the third wafer pod to a process tool,
      direct loading of the plurality of wafers into a fourth wafer pod following a performing of the process operation using the process tool,
      route the fourth wafer pod to a first post-process metrology tool,
      direct unloading of a third subset of the plurality of wafers into the first post-process metrology tool,
      route the fourth wafer pod to a second post-process metrology tool,
      direct unloading of a fourth subset of the plurality of wafers into the second post-process metrology tool, and
      direct loading of the third and fourth subsets into a fifth wafer pod after completion of a post-process metrology operation in the first and second post-process metrology tools.

* * * * *